(12) United States Patent
Bussmann et al.

(10) Patent No.: US 10,218,100 B2
(45) Date of Patent: Feb. 26, 2019

(54) CONNECTOR FOR ZERO-FORCE CONTACTING ON A PRINTED CIRCUIT BOARD

(71) Applicant: HARTING ELECTRONICS GMBH, Espelkamp (DE)

(72) Inventors: Rainer Bussmann, Bad Essen (DE); Marc Lindkamp, Luebbecke (DE)

(73) Assignee: HARTING ELECTRONICS GMBH (DE)

( * ) Notice: Subject to any disclaimer, the term of this patent is extended or adjusted under 35 U.S.C. 154(b) by 0 days.

(21) Appl. No.: 15/840,161

(22) Filed: Dec. 13, 2017

(65) Prior Publication Data

US 2018/0166815 A1 Jun. 14, 2018

(30) Foreign Application Priority Data

Dec. 13, 2016 (DE) .................. 10 2016 124 172

(51) Int. Cl.
*H01R 12/82* (2011.01)
*H01R 4/2429* (2018.01)
(Continued)

(52) U.S. Cl.
CPC .......... *H01R 12/82* (2013.01); *H01R 4/2429* (2013.01); *H01R 9/031* (2013.01); *H01R 12/675* (2013.01);
(Continued)

(58) Field of Classification Search
CPC .... H01R 12/675; H01R 4/2433; H01R 12/79; H01R 12/598; H01R 12/616; H01R 12/62; H01R 12/67
See application file for complete search history.

(56) References Cited

U.S. PATENT DOCUMENTS

| | | | | |
|---|---|---|---|---|
| 3,816,818 A | * | 6/1974 | Meier ................... | H01R 4/245 439/412 |
| 4,209,219 A | * | 6/1980 | Proietto ............... | H01R 12/675 439/405 |
| 4,697,862 A | * | 10/1987 | Hasircoglu .......... | H01R 12/675 439/394 |
| 4,798,544 A | * | 1/1989 | Hartman ............... | H01R 43/24 439/404 |

(Continued)

FOREIGN PATENT DOCUMENTS

| | | | |
|---|---|---|---|
| EP | 3044833 | 7/2016 | ............. H01R 12/72 |
| GB | 2510280 | 7/2014 | ............... H01R 4/24 |
| JP | S59152670 | 10/1984 | ............... H01R 4/24 |

OTHER PUBLICATIONS

German Search Report (w/machine translation) issued in application No. 10 2016 124 172.5, dated Sep. 25, 2017 (12 pgs).

*Primary Examiner* — Ross N Gushi
(74) *Attorney, Agent, or Firm* — Hayes Soloway P.C.

(57) ABSTRACT

A connector for installation on a printed circuit board a contacting part has which includes at least two contact elements, each of which can be connected, on the connection side, to an individual conductor and, on the plug-in side, to a conductive track of the printed circuit board, wherein the connector a connection part which encloses the individual conductors and, in the region of each individual conductor, has a recess, into each of which a contact element engages for the electrical connection between individual conductor and contact element. The contacting part is formed in an injection molding process, wherein at least two contact elements having an insulation-displacement connector are inserted or engaged in the contacting part or are directly encapsulated, and the connection part is formed in an injection molding process, wherein at least two individual (Continued)

conductors, each having a cable sheath, are thus placed in an injection molding tool and are encapsulated.

9 Claims, 4 Drawing Sheets

(51) Int. Cl.
| | |
|---|---|
| H01R 9/03 | (2006.01) |
| H01R 12/67 | (2011.01) |
| H01R 12/70 | (2011.01) |
| H01R 12/71 | (2011.01) |
| H01R 43/24 | (2006.01) |
| H01R 12/00 | (2006.01) |
| H01R 13/436 | (2006.01) |
| H05K 3/36 | (2006.01) |
| H01R 13/621 | (2006.01) |
| H01R 13/64 | (2006.01) |
| H01R 43/20 | (2006.01) |

(52) U.S. Cl.
CPC ....... H01R 12/7094 (2013.01); H01R 12/716 (2013.01); H01R 43/24 (2013.01); *H01R 9/095* (2013.01); *H01R 13/4368* (2013.01); *H01R 13/621* (2013.01); *H01R 13/64* (2013.01); *H01R 43/205* (2013.01); *H05K 3/366* (2013.01)

(56) References Cited

U.S. PATENT DOCUMENTS

| | | | | |
|---|---|---|---|---|
| 4,874,908 | A * | 10/1989 | Johansson | H01B 7/0045 174/72 A |
| 4,927,387 | A * | 5/1990 | Eckler | H01R 12/79 29/857 |
| 5,281,762 | A * | 1/1994 | Long | H01R 9/0515 174/117 F |
| 5,551,889 | A * | 9/1996 | Kozel | H01R 4/245 439/404 |
| 5,890,924 | A * | 4/1999 | Endo | H01R 4/2433 439/404 |
| 6,210,205 | B1 * | 4/2001 | Huang | H01R 12/675 439/405 |
| 6,274,815 | B1 * | 8/2001 | Kawaguchi | F16L 3/2235 174/72 A |
| 6,979,222 | B2 * | 12/2005 | Comini | H01R 4/2458 439/395 |
| 8,714,992 | B2 * | 5/2014 | Truemper | H01R 4/2433 439/275 |
| 9,246,241 | B2 * | 1/2016 | Yamamoto | H01R 4/18 |
| 9,472,863 | B2 * | 10/2016 | Ozaki | H01R 12/772 |
| 9,692,161 | B2 | 6/2017 | Lindkamp et al. | H01R 12/75 |
| 2017/0256868 | A1 | 9/2017 | Mathews et al. | H01R 4/242 |

* cited by examiner

CONNECTOR FOR ZERO-FORCE CONTACTING ON A PRINTED CIRCUIT BOARD

BACKGROUND OF THE INVENTION

The invention is directed to a connector for installation on a printed circuit board. Such connectors are frequently utilized in junctions of continuous cable harnesses, for example in the cabling of elevator shafts.

BRIEF DESCRIPTION OF THE PRIOR ART

Conventional connectors for installation on printed circuit boards are usually soldered onto the printed circuit board. Although this type of contacting is highly stable, corresponding connectors can be exchanged, when necessary, only with great difficulty.

Connectors that can be reversibly attached onto a printed circuit board generate mechanical stress on the printed circuit board during the plug-in process. As a result, the printed circuit board can become damaged after only a few insertion/withdrawal cycles.

EP 3 044 833 A1 describes a connector which comprises contact elements which can engage laterally onto conductive tracks of a printed circuit board. Such connectors can be easily exchanged. Such connectors have the disadvantage, however, that they can engage onto a printed circuit board only from the side. The printed circuit board must be explicitly adapted for such connectors. In addition, the contacting of such a connector can be loosened by way of mechanical movements on a cable bundle, whereby faults can easily occur.

SUMMARY OF THE INVENTION

The problem addressed by the invention is that of providing a connector for installation on a printed circuit board, which is easy to exchange and, thus, only slightly mechanically loads the printed circuit board.

The connector according to the invention is intended for installation on a printed circuit board. The connector comprises a contacting part. At least two contact elements are situated in the contacting part, each of which can be connected, on the connection side, to an individual conductor and, on the plug-in side, to a conductive track of the printed circuit board. The contacting part is made of plastic. The contact elements are engaged in the contacting part or they are directly encapsulated in an injection molding process.

The connector comprises a connection part. Situated in the connection part are at least two individual conductors which can be electrically connected to the at least two contact elements in the contacting part. The individual conductors are surrounded or enclosed, at least in sections, by the plastic material of the connection part. The connection part comprises a recess in the region of each individual conductor. A contact element of the contacting part can engage into the recess for the electrical connection between the individual conductor and the contact element.

In one advantageous variant of the invention, the individual conductors are encapsulated by a plastic material. The connection part is then formed by the plastic material and the individual conductors surrounded thereby. This variant offers advantages during the plugging-in of such a connector. The individual conductors no longer need to be placed into a so-called cable manager and organized. Such a connector offers great advantages, for example, to a service technician, in particular when the connector is located at difficult-to-access points and must be exchanged.

Preferably, the contact elements are designed, on the connection side, as an insulation-displacement connector or as a piercing. As a result, the connector can be easily assembled. The insulation-displacement connector can penetrate the cable sheath of the individual conductors in the connection part and, in this way, establish an electrical contact between the contact element and the individual conductors. The piercing can also puncture the cable sheath of the individual conductor and, in this way, effectuate an electrical contacting. In the latter case, the individual conductor should then be designed as a so-called stranded conductor, however.

Advantageously, the contacting part comprises at least one guide segment. By way of the guide segment, the connection part can be oriented with respect to the contacting part in an accurately fitting manner. As a result, the contact elements are precisely guided, on the connection side, into the recesses of the connection part provided therefor. A simple assembly of the connector is made possible as a result.

In one particularly preferred variant of the invention, the contacting part comprises at least two guide segments. The guide segments are situated at the ends of the contacting part. As a result, a particularly precise guidance and a uniform force transmission of the contact elements onto the particular individual conductors during assembly are ensured.

Preferably, the connection part and the contacting part are connected to each other via at least one screw. A screw connection is easy to release again. Every service technician has a screwdriver on hand. When the contacting part comprises two guide segments integrally formed at the ends thereof, it is advantageous when the connection part and the contacting part are connected to each other via precisely one screw and the screw is situated in the center.

In yet another variant of the invention, the connection part and the contacting part are connected to each other via two screws. The screws are each situated at one end of the connector. In this case, the connector would have a guide segment in the center. This variant can also be assembled precisely and easily.

Advantageously, the screw or the screws has or have an unthreaded region and a threaded region. As a result, the screws perform a dual function. On the one hand, the screws perform the function of a guide segment, by way of which the connection part can be oriented with respect to the contacting part in an accurately fitting manner. At the same time, the screws connect the connection part and the contacting part to each other.

The invention also relates to a method for manufacturing a connector as above described.

In the method according to the invention, a contacting part is formed in an injection molding process. At least two contact elements having an insulation-displacement connector are inserted or engaged in the contacting part or are encapsulated therewith directly in the injection molding process.

In addition, a connection part is produced in an injection molding process. In this injection molding process, at least two individual conductors, each of which has a cable sheath, are placed in an injection molding tool and are encapsulated in a plastic material. The plastic material, which is subsequently removed from the mold, forms the connection part together with the individual conductors. The number of individual conductors can arbitrarily vary in this process step. A flat ribbon cable is not utilized here, but rather individual conductors are explicitly utilized.

During the manufacture of the connection part, so-called sucker pins are inserted into the injection molding tool. Due to the sucker pins, the recesses are formed in the region of the individual conductors of the connection part.

The sucker pins can also perform another very important dual function, however. The cable sheaths of the individual conductors placed in the injection molding tool are prefabricated during the insertion of the sucker pins into the injection molding tool. This means that the cable sheaths are each nicked by the sucker pins. Due to the previous nicking of the cable sheaths in the region of the recesses, the individual conductors can be inserted, using a small amount of force, into the connection regions of the contact elements formed as insulation-displacement connectors. The prefabrication of the cable sheaths by means of the sucker pins makes it possible to join the connection part and the contacting part in an approximately zero-force manner. The remaining force that is still required to guide the conductor cores into the particular connection regions of the contact elements is absorbed entirely by the contacting part. No force is transmitted to the printed circuit board, and therefore the electrical contacting between the connector and the printed circuit board is not mechanically loaded. As a result, the connector is a solution having a very long service life. If necessary, a new connection part, including new individual conductors surrounded thereby, can be connected to the (old) contacting part located on the printed circuit board.

The process steps for producing the connection part and the contacting part can be carried out in any sequence. It does not matter which of the two parts, either the connection part or the contacting part, is produced first. Ideally, the two process steps run in parallel on different machines.

The contacting part is subsequently fastened on a circuit board and the contact elements located therein are contacted to the corresponding conductive tracks of the printed circuit board. Ideally, a soldering process is utilized in this case.

In the following process step, the contacting part and the connection part are joined. Thus, one contact element is electrically contacted to an individual conductor in each case. The contact elements thus engage, on the connection side, into recesses in the connection part provided therefor.

Subsequently, the contacting part is reversibly connected to the connection part. Ideally, the contacting part and the connection part are screwed together.

BRIEF DESCRIPTION OF THE DRAWINGS

One exemplary embodiment of the invention is represented in the drawings and is described in greater detail in the following. In the drawings.

The figures contain partially simplified, schematic representations. Identical reference numbers are used, in part, for elements that are similar but that may not be identical. Different views of similar elements could be scaled differently.

DETAILED DESCRIPTION OF THE INVENTION

Figure 1:
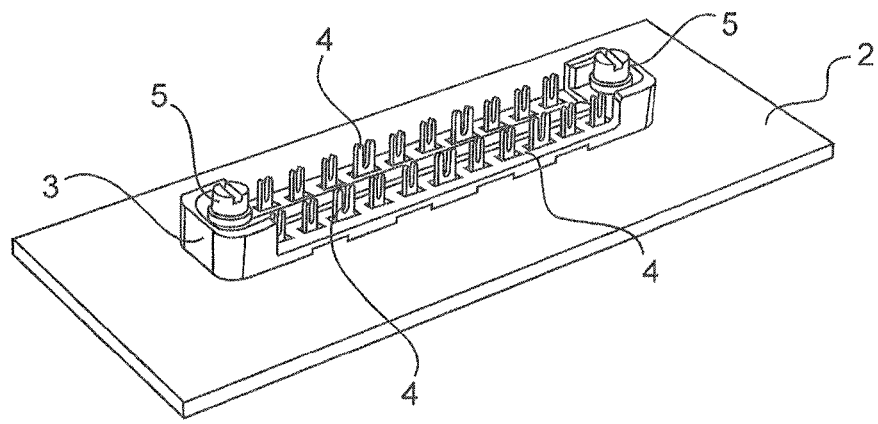
FIG. 1 shows a perspective representation of a first embodiment of a contacting part soldered on a printed circuit board.
Figure 1A:
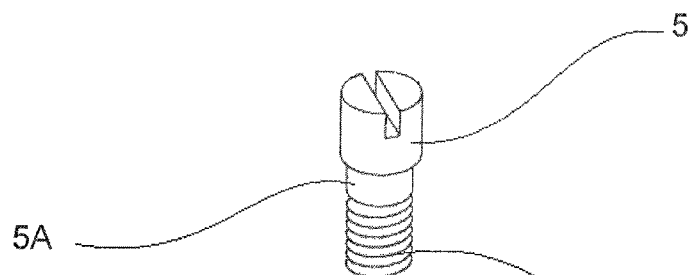
FIG. 1A is a perspective representative of a screw element part.

FIG. 1 shows a printed circuit board 2 on which a contacting part 3 has been soldered. The soldering points are located on the underside of the printed circuit board 2 and are not visible in the figures shown here. Contact elements 4, which are formed as insulation-displacement connectors on the connection side, are engaged in the contacting part 3. This is also referred to as an insulation-displacement contact. The contacting part 3 comprises a screw 5 at each of its ends. The screws 5 each comprise an unthreaded region 5A and a threaded region 5B (see FIG. 1A).

Figure 2:
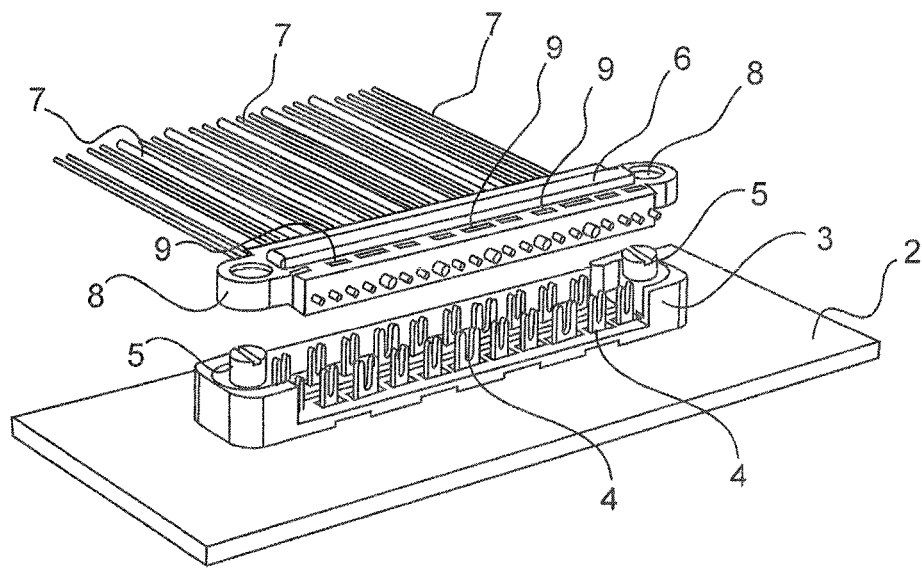
FIG. 2 shows a perspective representation of the contacting part soldered on a printed circuit board including a first embodiment of a connection part.

In FIG. 2, a connection part 6 is shown in addition to the contacting part 3. A plurality of individual conductors 7 has been embedded in the connection part 6 in an injection molding process. The individual conductors 7 can be designed differently and can have different diameters, for example. The connection part 6 can be produced individually by way of the installation of individual conductors 7 thereon. The cable sheath of the individual conductors 7 is bonded with the plastic material of the connection part 6 by means of the injection molding process, and therefore the individual conductors 7 are situated in the connection part 6 in a captive and non-displaceable manner. The connection part 6 contains recesses 8 at the ends thereof, or a single recess 8 situated in the center of the connection part 6, (FIG. 3A) which align with the screw or screws 5 of the contacting part 3 during the process of joining the connection part 6 and the contacting part 3. Recesses 9, which are provided in the region of the individual conductors 7, are formed in the connection part 6. These recesses 9 are produced in the injection molding process by means of so-called sucker pins which engage into the injection mold. The cable sheaths of the single individual conductors 7 are prefabricated by means of the sucker pins. This means that the cable sheaths of the individual conductors 7 have already been slightly nicked in advance or have been provided with initial nicks in the region of the recesses 9.

Figure 3:
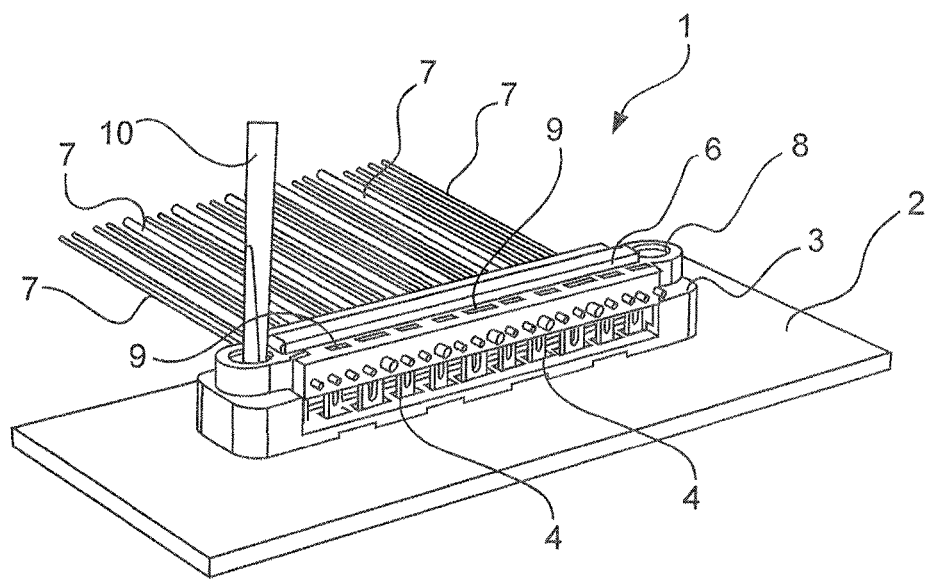
FIG. 3 shows a perspective representation of a connecting process of the contacting part including the first embodiment of a connection part.
Figure 3A:
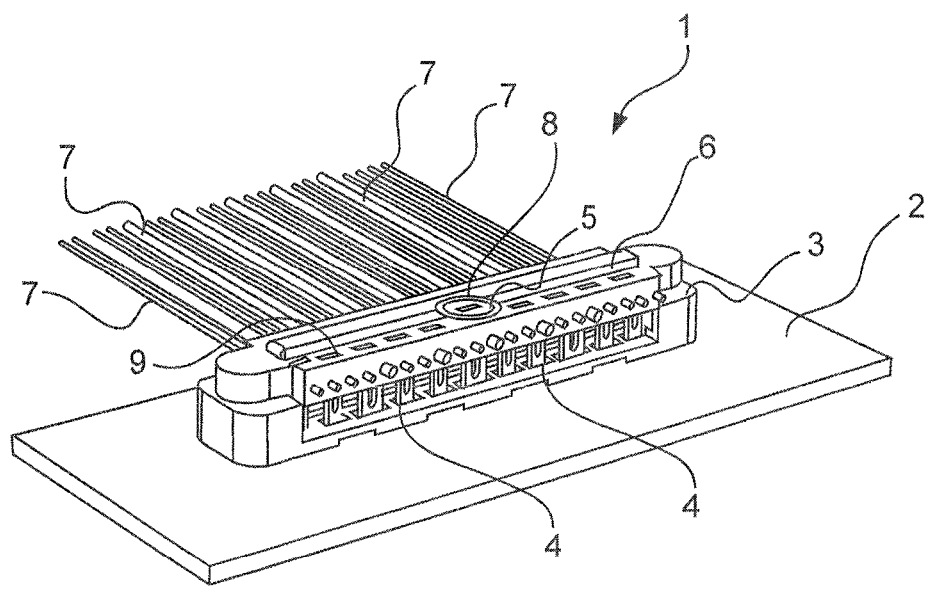
FIG. 3A is a view similar to FIG. 3 of an alternative embodiment of a connection part.

The process of joining the contacting part 3 and the connection part 6 is shown in FIG. 3. The connector 1 according to the invention is formed by way of the joining process. The contacting part 3 and the connection part 6 are oriented with respect to each other in an accurately fitting manner by means of the unthreaded region of the screws 5 which engage into the corresponding recesses 8. During the screwing-together of the contacting part 3 and the connection part 6 with the aid of a simple screwdriver 10, the insulation-displacement connectors 4 of the contacting part 3 are guided into the recesses 9 of the connection part 6 assigned to the individual conductors 7. Due to the above-described prefabrication of the individual conductors 7, only a small amount of force is required to pass the insulation-displacement connectors of the contact elements 4 through the cable sheaths of the individual conductors 7. The electrical contacting of individual conductor 7 and associated contact element 4 can take place in an approximately zero-force manner. The force that is necessary during the joining of the contacting part 3 and the connection part 6 is completely absorbed by the contacting part 3. The printed circuit board 2 is not mechanically loaded during this process, which substantially increases the service life of the connector 1. By means of this design, it is also possible to fix a new connection part 6 onto an old contacting part 3, when necessary.

Figure 4:
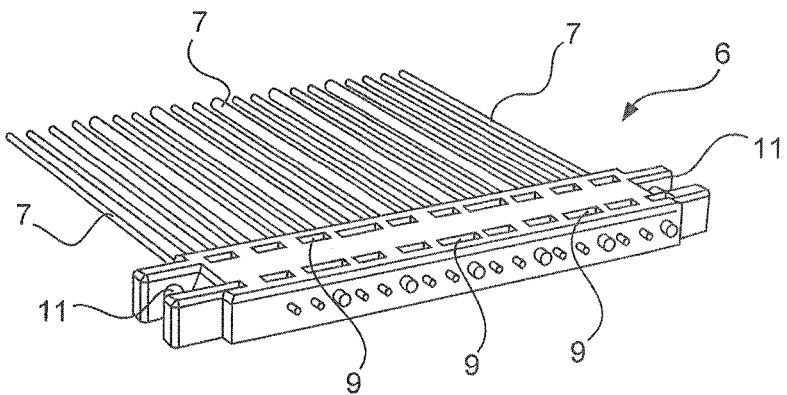
FIG. 4 shows a perspective representation of a second embodiment of a connection part.
Figure 5:
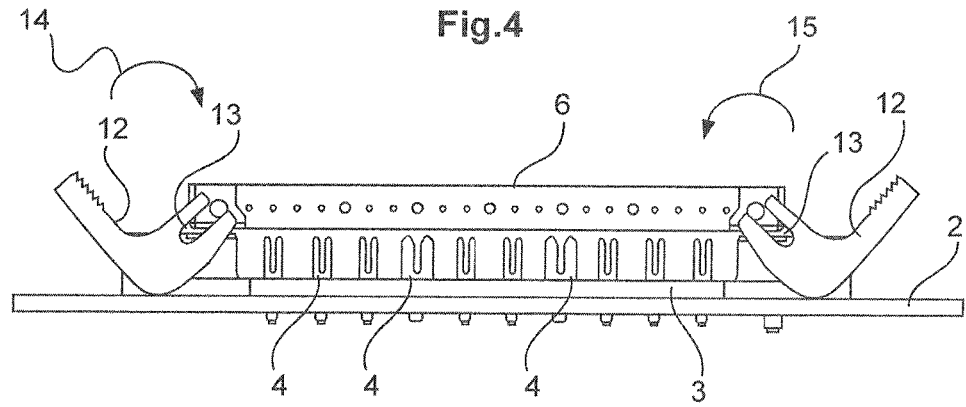
FIG. 5 shows a cross-sectional representation of the second embodiment of the connection part in the connecting process including a second embodiment of a contacting part (shown here without the plastic body)
Figure 6:
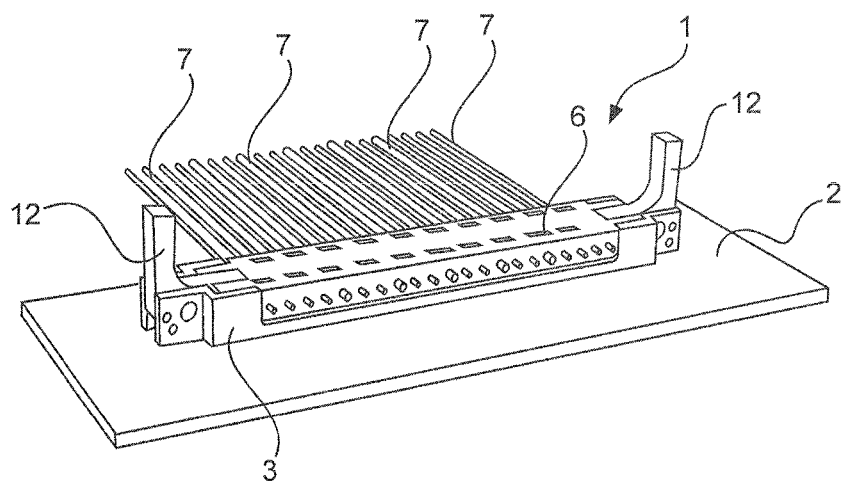
FIG. 6 shows a perspective representation of a connector according to the second embodiment.

Another alternative embodiment of the connector 1 according to the invention is represented in FIGS. 4 to 6. This embodiment differs from the first embodiment essentially in terms of the fixing mechanism between the contacting part 3 and the connection part 6. The connection part 6 comprises lateral segments 11. The contacting part 3 comprises, on the sides thereof, L-shaped fastening arms 12, in each of which a guide groove 13 has been formed. The actuating arms 12 are movably mounted on the contacting part 3.

FIG. 5 shows the way in which the connection part 6 is joined with the contacting part 3. The lateral segments 11 of the connection part 6 engage into the particular guide groove 13 of the actuating arm 12 of the contacting part 3. The insulation-displacement connectors 4 are guided into the recesses 9 of the connection part 6 by pivoting the actuating arms 12 inward, in the direction of the arrows 14 and 15. Thus, the prefabricated individual conductors 7 are guided into the insulation-displacement connector region of the assigned contact elements 4, whereby an electrical contacting is generated between the contact elements 4 and the associated individual conductors 7. The embodiment according to FIGS. 5 and 6 is entirely implemented without any further tools and, therefore, is particularly easy for a service technician to install. Removal takes place by pivoting the actuating arms 12 outward (counter to the arrows 14 and 15). Due to the actuating arms, the force for installing and removing the connection part 6 is fully supported by the contacting part 3. The printed circuit board 2 is mechanically protected as a result.

Figure 7:
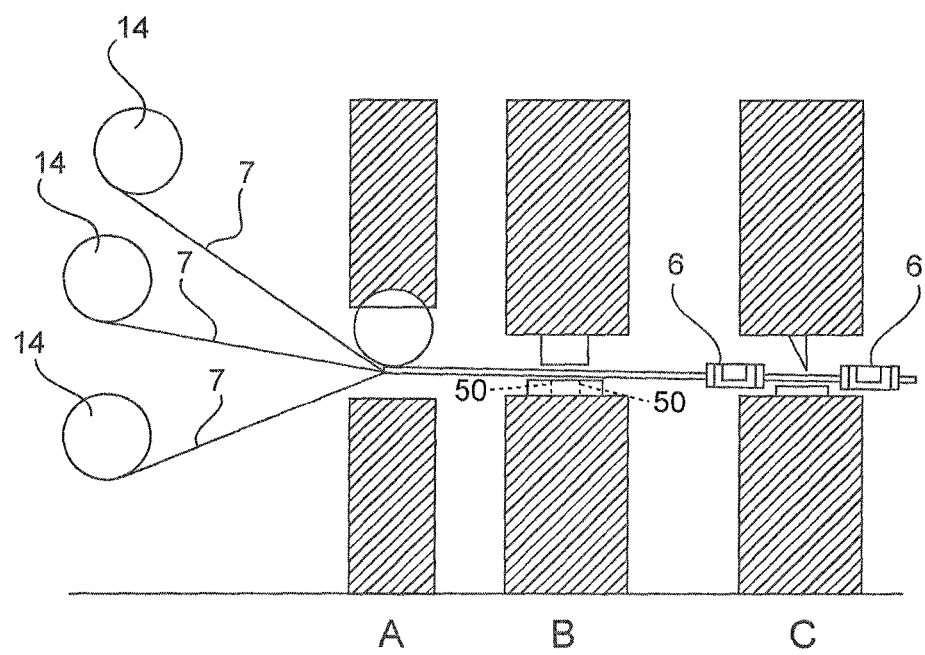
FIG. 7 shows a schematic representation of a method for producing a connection part for a connector according to the invention.

A method for producing a connection part 6, which is used in the connector 1 according to the invention, is schematically represented in FIG. 7. Individual conductors 7—optionally having different thicknesses and electrical properties—are mounted on rollers 14. In a first process step A, a desired number of the individual conductors 7 are gathered together and bundled. A flat ribbon cable is explicitly not formed, however. The individual conductors 7 can be arbitrarily permuted by the rollers. The number of individual conductors 7 can also be arbitrarily selected. The process proposed here is therefore particularly flexible. The individual conductors 7 are situated in parallel next to each other. In a subsequent process step B, the bundled individual conductors 7 are placed into an injection mold having sucker pins shown in phantom at 50 which engage into the injection mold, and are encapsulated in a plastic material. A connection part 6 according to the invention is produced as a result. In the process step C, the bundled individual conductors 7 are trimmed. The length of cut can vary, in this case, depending on the field of use of the connector 1.

In one alternative variant, in the process step B, two plastic bodies, which are spaced slightly apart from each other, are injected onto the bundled individual conductors. The second plastic body is used, in this case, as a second plug-in option, when, for example, a service technician has used up the insertion/withdrawal cycles of the first plastic body. As a result, it is ensured that all individual conductors do not have to be exchanged at once. This solution not only prevents maintenance, it is also particularly environmentally friendly, since less waste is produced.

The contacting part (3) is also produced in an injection molding process. Such a process step can take place in parallel to the aforementioned process steps. Subsequently, the contacting part (3) is soldered on a printed circuit board 2.

Connector for Zero-force Contacting on a Printed Circuit Board

LIST OF REFERENCE NUMBERS

| | |
|---|---|
| 1 | connector |
| 2 | printed circuit board |
| 3 | contacting part |
| 4 | contact element |
| 5 | screw |
| 6 | connection part |
| 7 | individual conductor |
| 8 | recess |
| 9 | recess |
| 10 | screwdriver |
| 11 | segment |
| 12 | actuating arm |
| 13 | guide segment |
| 14 | roller |
| 15 | |
| 16 | |
| 17 | |
| 18 | |
| 19 | |
| 20 | |
| A, B, C | process step |

The invention claimed is:

1. A connector for installation on a printed circuit board, wherein the connector comprises a contacting part which includes at least two contact elements, each of which can be connected, on a connection side, to an individual conductor and, on a plug-in side, to a conductive track of the printed circuit board, wherein the connector comprises a connection part which encloses the individual conductors and, in the region of each individual conductor, has a recess, into each of which a contact element engages for the electrical connection between individual conductor and contact element, and wherein the connection part and the contacting part are connected to each other via precisely one screw and the screw is situated in the center.

2. The connector as claimed in claim 1, wherein the individual conductors are encapsulated in a plastic material and the plastic material, in combination with the individual conductors, forms the connection part.

3. The connector as claimed in claim 1, wherein the contact elements are designed, on the connection side, as an insulation-displacement connector or as a piercing.

4. The connector as claimed in claim 1, wherein the contacting part comprises at least one guide segment, by way of which the connection part is oriented with respect to the contacting part in an accurately fitting manner.

5. The connector as claimed in claim 4,
wherein the contacting part comprises at least two guide segments, each of which is situated at one end.

6. The connector as claimed in claim 4,
wherein the screw comprises an unthreaded region and a threaded region and, as a result, orient the connection part with respect to the contacting part in an accurately fitting manner and simultaneously reversibly connect the connection part and the contacting part to each other.

7. A method for producing a connector, comprising the steps of:
- a contacting part is formed in an injection molding process, wherein at least two contact elements having an insulation-displacement connector are inserted or engaged in the contacting part or are directly encapsulated,
- a connection part is formed in an injection molding process, wherein at least two individual conductors, each having a cable sheath, are thus placed in an injection molding tool and are encapsulated, wherein
- in the connection part, recesses are formed in the region of the individual conductors by inserting sucker pins in the injection molding tool.

8. The method for producing a connector as claimed in claim 7, wherein
the sucker pins prefabricate the cable sheath of the individual conductors.

9. The method for producing a connector as claimed in claim 7, wherein
the contacting part is fastened on a printed circuit board, and
the contacting part is joined with the connection part, whereby one contact element is electrically contacted with an individual conductor in each case.

* * * * *